United States Patent [19]

Ponder et al.

[11] 4,325,169
[45] Apr. 20, 1982

[54] METHOD OF MAKING CMOS DEVICE ALLOWING THREE-LEVEL INTERCONNECTS

[75] Inventors: James E. Ponder, Cat Spring; Graham S. Tubbs; Perry W. Lou, both of Houston, all of Tex.; Stephen A. Farnow, Beaverton, Oreg.

[73] Assignee: Texas Instruments Incorporated, Dallas, Tex.

[21] Appl. No.: 83,700

[22] Filed: Oct. 11, 1979

[51] Int. Cl.³ .................. H01L 21/225; B01J 17/00
[52] U.S. Cl. .................................... 29/571; 29/578; 148/1.5; 148/187; 357/42; 357/65; 357/91
[58] Field of Search ............... 148/1.5, 187; 29/571, 29/578; 357/42, 65, 91

[56] References Cited

U.S. PATENT DOCUMENTS

| | | | |
|---|---|---|---|
| 4,033,797 | 7/1977 | Dill et al. | 148/187 |
| 4,047,284 | 9/1977 | Spadea | 29/571 |
| 4,109,371 | 8/1978 | Shibata et al. | 29/571 |
| 4,151,631 | 5/1979 | Klein | 29/571 |
| 4,152,823 | 5/1979 | Hall | 29/571 |
| 4,217,149 | 8/1980 | Sawazaki | 148/1.5 |
| 4,224,733 | 9/1980 | Spadea | 29/571 |
| 4,244,752 | 1/1981 | Henderson et al. | 148/1.5 |

*Primary Examiner*—Upendra Roy
*Attorney, Agent, or Firm*—John G. Graham

[57] ABSTRACT

An improved CMOS device and method of making it are provided which utilize basically the standard N-channel self-aligned silicon gate structure and process (with implants for self-alignment), modified to include P-channel transistors and to allow three levels of interconnects. A P-type substrate is used as the starting material, with an N-type tank formed for the P-channel transistor. The source and drain regions, N+ or P+, are defined prior to the polycrystalline silicon gate; thus the source and drain may run under polysilicon. Self-aligning implants after the polysilicon is defined produce the advantages of self-aligned gates.

6 Claims, 14 Drawing Figures

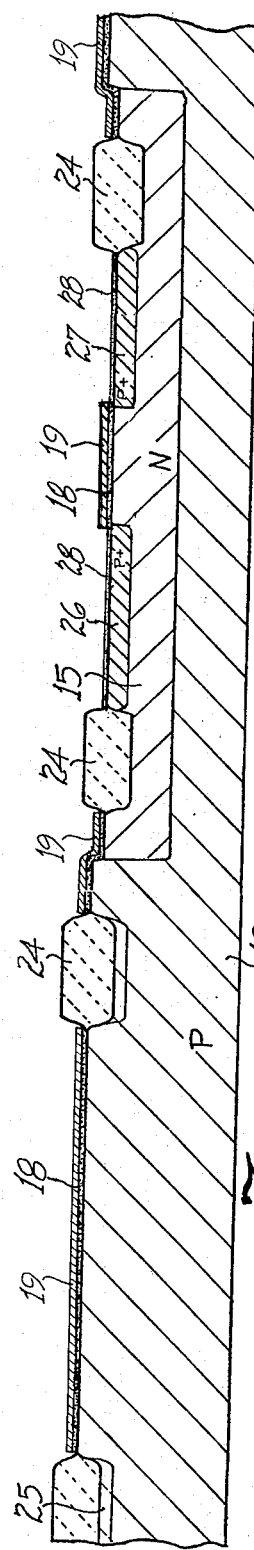
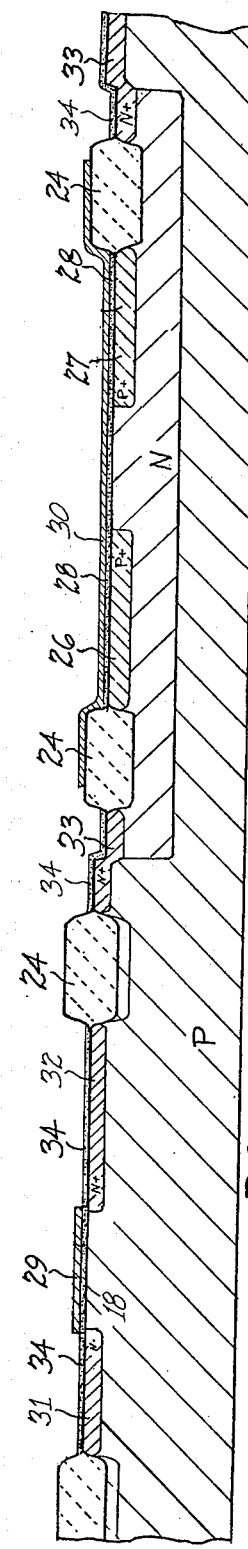
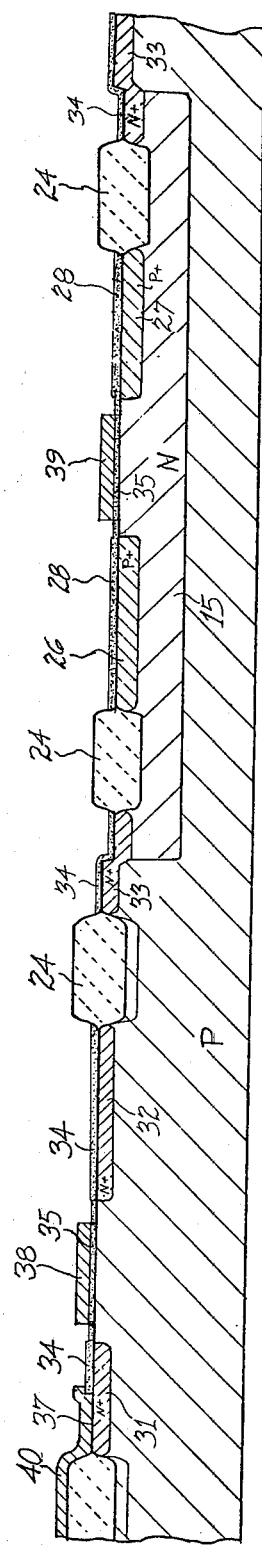

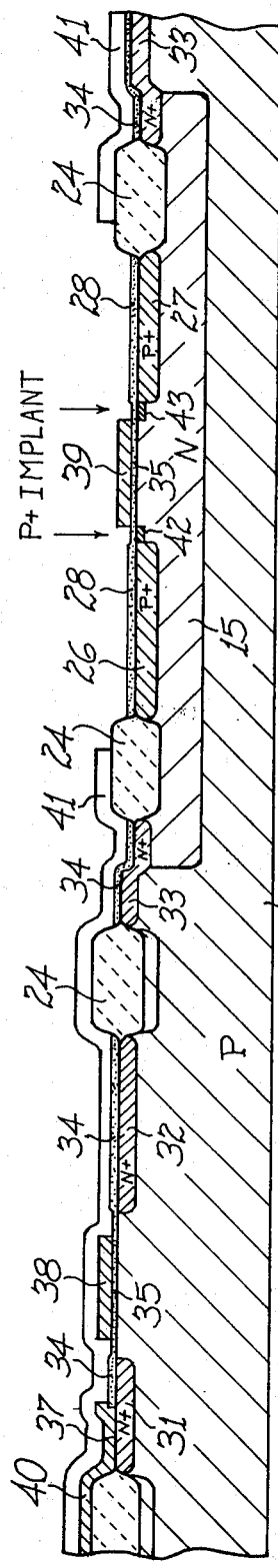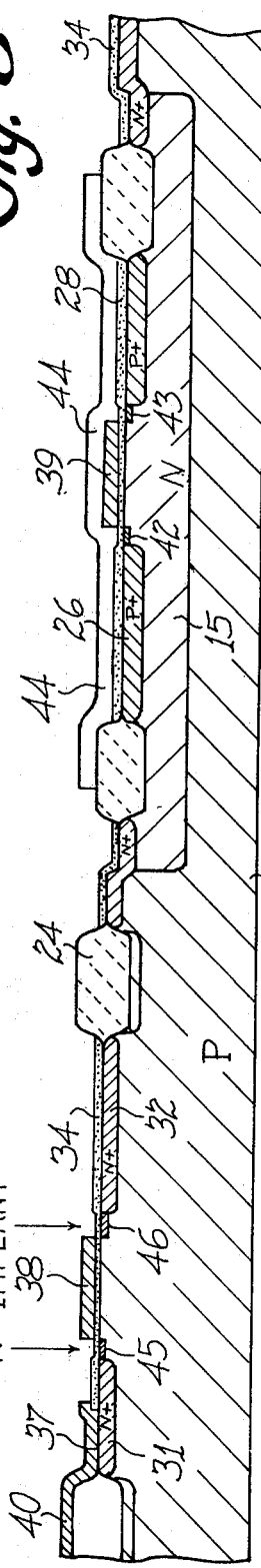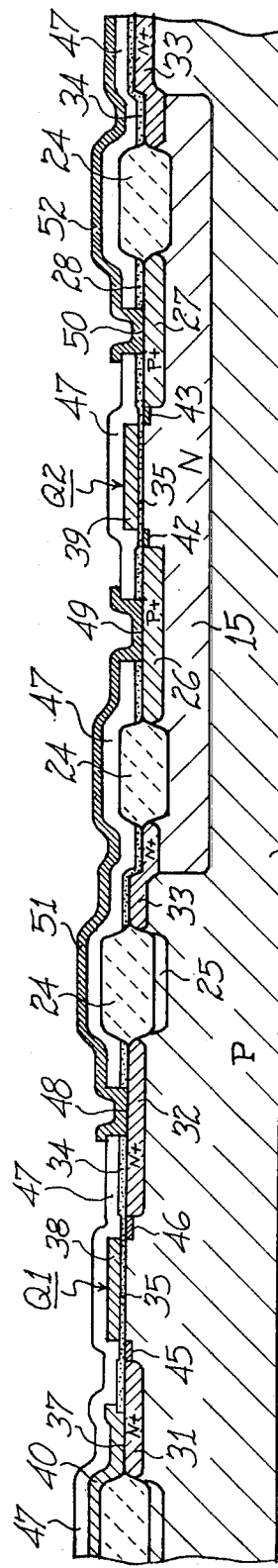

METHOD OF MAKING CMOS DEVICE ALLOWING THREE-LEVEL INTERCONNECTS

BACKGROUND OF THE INVENTION

This invention relates to integrated semiconductor devices and methods of manufacture, and more particularly to an improved method of making complementary insulated gate field effect (CMOS) transistors in integrated circuit form.

Complementary FET or "CMOS" devices have long been recognized as offering significant advantages in the area of low power consumption. However, most MOS memory and processor type devices now being manufactured are N-channel because of speed, circuit density and cost factors which heretofore have favored NMOS over CMOS. A process which reverses the usual sequence of making CMOS devices is disclosed in copending application Ser. No. 081,513, filed Oct. 3, 1979, assigned to Texas Instruments; the P-channel transistors are formed in N-type tanks in a P-type substrate so the method resembles the standard N-channel silicon gate process. Prior CMOS methods had formed N-channel transistors in P-type tanks in an N-type substrate.

As an improvement in the reversed CMOS process, it has been found that significant advantages result in a method which employs self-aligning implants adjacent each gate in the source-drain areas as will be explained.

It is the principal object of this invention to provide improved CMOS integrated circuit devices and an improved method of making such devices. Another object is to provide CMOS devices and methods of making devices which allow the speed advantage of N-channel transistors to be utilized, and which provide smaller size or higher circuit density with higher speed and/or lower cost. A further object is to provide CMOS devices which have self-aligned gates and yet allow polysilicon to cross over moat regions without forming transistors.

SUMMARY OF THE INVENTION

In accordance with an embodiment of the invention, an improved CMOS device and method of making it are provided which utilize basically the standard N-channel self-aligned silicon gate structure and process (with implants for self-alignment), modified to include P-channel transistors and to allow three levels of interconnects. A P-type substrate is used as the starting material, with an N-type tank formed for the P-channel transistor. The source and drain regions, N+ or P+, are defined prior to the polycrystalline silicon gate; thus the source and drain may run under polysilicon. Self-aligning implants after the polysilicon is defined produce the advantages of self-aligned gates.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 1-10 are elevation views in section of a small part of a semiconductor chip at successive stages of manufacture of two transistors, one P-channel and one N-channel;

DETAILED DESCRIPTION OF SPECIFIC EMBODIMENT

Figure 1:
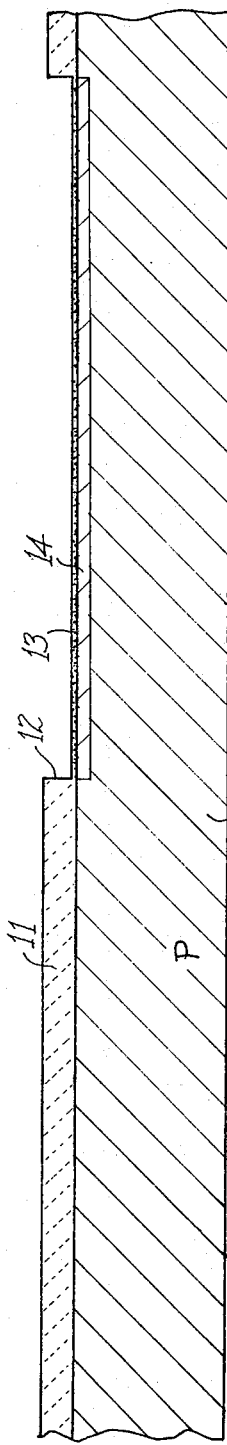

A process for making CMOS devices according to the invention will be described with reference to FIGS. 1-10. The starting material is a slice of P-type silicon doped in growing to a resistivity of about 15 ohm-cm. The segment 10 of the slice seen in the figures contains two transistors and is only a small part of what will be one bar, with the slice including perhaps two or three hundred bars. A processor device of the type used for a handheld calculator contains ten to twenty thousand transistors on a bar less than 150 mils on a side, so the transistors occupy less than about one mil in width. First, the slice is cleaned and a thick thermal oxide layer 11 is grown by maintaining the slice in steam at 900° C. for several hours, producing about 10,000 Å thickness. A photoresist masking operation is used to etch the oxide layer 11 to bare silicon in locations 12 where P-channel transistors are to be formed. A thin layer 13 of thermal oxide may be regrown in the location 12 as seen in FIG. 1 to avoid implant damage and outdiffusing, but this is not required. The slice is subjected to a phosphorus ion implant at 150 KeV with a dosage of about $3 \times 10^{12}$ per cm$^2$ to produce a shallow implanted region 14 in the location 12; the thick silicon oxide masks the implant.

Figure 2:
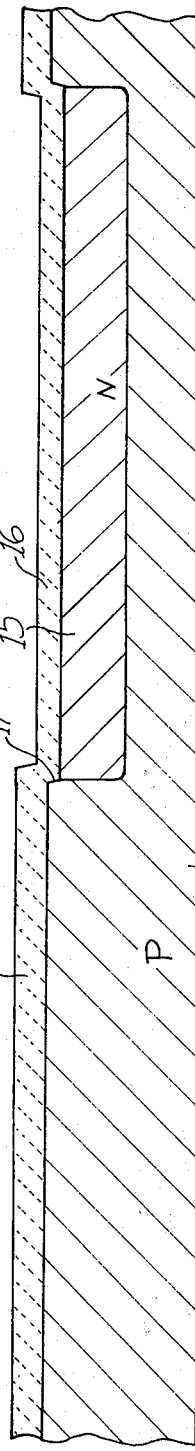

Referring now to FIG. 2, the next step is the N diffusion or tank drive. The slice is held in a tube furnace at a high temperature of about 1200° C. to drive the implanted phosphorus into the silicon to produce a region 15 with a junction depth of about 5 microns. Part of the time in the furnace is in a steam atmosphere so a thermal oxide layer 16 of about 8000 Å is grown while the original layer 11 grows somewhat thicker. Silicon is consumed by the oxidation, but due to the masking effect of the remaining oxide layer 11, the growth rate differential produces a step 17 in the surface which will be needed for subsequent alignment.

Figure 3:
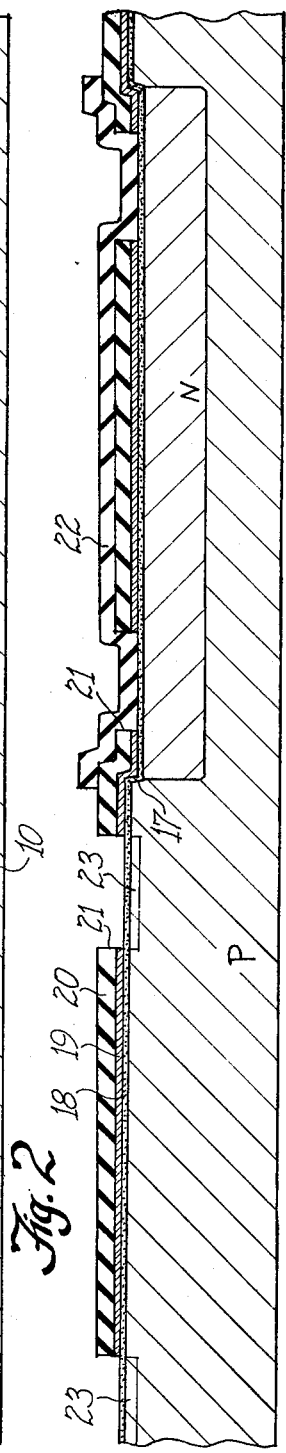

Turning now to FIG. 3, the next step is removal of all of the oxide layers 11 and 16 from the slice, leaving the step 17 of about 2000 Å, then a thin thermal oxide layer 18 is regrown to about 1000 Å. A layer 19 of silicon nitride is then deposited over the thermal oxide. A coating 20 of photoresist is deposited and exposed to light through a mask which defines the areas to become field oxide, so upon developing holes 21 are left in the photoresist, and an etchant then removes the nitride layer 19 at the holes 21. Next, another layer 22 of photoresist is deposited and exposed to light through a mask which defines the N-type tank regions 15 so upon developing the resist all the tank areas remain covered; the mask used for this photoresist is essentially a color reversal of the tank mask. Using the two photoresist layers as a mask, a boron implant of about $5 \times 10^{12}$ per cm$^2$ at 100 KeV produces P+ regions 23 where channel stops are to be formed. To cure implant damages, a nitrogen anneal is performed as set forth in U.S. Pat. No. 4,055,444 issued to G. R. Mohan Rao, assigned to Texas Instruments. This anneal also pushes the implanted boron deeper into the substrate so less is lost in subsequent oxidation.

Figure 4:
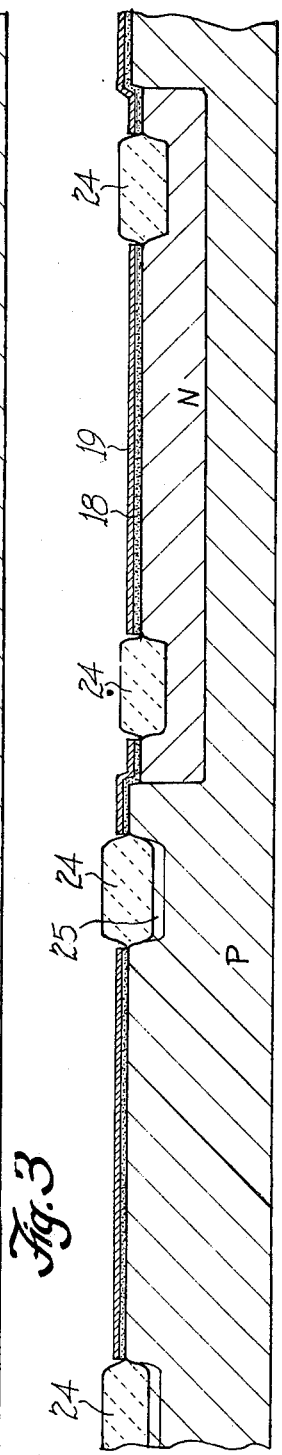

As will be seen in FIG. 4, after removing photoresist a thermal oxidation step at 900° C. in steam for several hours produces a field oxide coating 24 in all areas not masked by the nitride. The oxide thickness is about 9000 Å. Channel stop regions 25 are formed beneath the field oxide 24 by diffusion from the implanted P+ regions 23. Part of the implanted boron is consumed with the silicon upon oxidation, but part diffuses ahead of the oxidation front. No channel stop regions are needed beneath the field oxide in the N-type tank regions 15 because of the higher concentration of N-type impurities.

Referring to FIG. 5, the P+ source and drain regions 26 and 27 are next formed by selectively removing the remaining nitride layer 19 and oxide layer 18 above certain parts of the N-type tank 15, using photoresist masking, the depositing boron from $BBr_3$ at 1000° C. After the subsequent heat treatments the resultant diffused P+ regions 26 and 27 have a junction depth of about 2 microns. An oxidation step produces a coating 28 of thermal oxide of about 800 Å over the P+ regions 26 and 27 to reduce capacitive coupling between the P+ regions and polysilicon in the finished device. All of the nitride layer 19 is then removed by an etchant.

FIG. 6 illustrates the next steps in the process. Another layer of silicon nitride is deposited then patterned to leave an area 29 of nitride over what is to be the N-channel transistor and a coating 30 of nitride over the N-type tank 15. A phosphorus deposition from $POC2_3$ and diffusion at 950° C. is used to produce N+ source and drain regions 31 and 32 and N+ guard ring regions 33 surrounding the N-type tanks 15, with final resulting junction depth about 1.2 micron. Then an oxidation step produces a barrier oxide layer 34 over the N+ regions to a thickness of about 2000 Å. The nitride layer 29 and 30 is then removed by etching.

Turning now to FIG. 7, the next step in the process includes removing the remaining nitride coating 29 and 30, and then an etch step is used in the moat areas to remove the thin oxide for the gates of the N-channel and P-channel transistors Q1 and Q2. Oxide is removed without excess etch so that most of the oxide 28 and 34 will remain in place over the source and drain areas. Next, the gate oxide layer 35 is grown over all exposed silicon surfaces by thermal oxidation to a thickness of 600 Å. This thickness is selected so that the threshold voltages for the N-channel and P-channel transistors will be +0.8 and −0.8, respectively, taking into account other process parameters such as surface concentrations, QSS, metal work functions, etc., and assuming a single boron implant for Vt adjust which is done at this point with no masking required.

At locations 37 where polysilicon-to-silicon contact is to be made, the oxide 28 or 34 is removed using a photoresist operation. The next step in the process is deposition of a polycrystalline silicon layer over the entire top surface of the slice to form the gates of the transistors and certain interconnections. A phosphorus deposition at this time functions to dope the polysilicon and render it high conductive (N-type). The poly is doped N-type even over the P-channel transistors Q2, in contrast to prior methods; this simplifies the process. A coat of photoresist is then deposited over the polysilicon, and exposed to light through a mask which defines the gates 38 and 39 and interconnection 40, then developed. Etching removes the uncovered polysilicon. It is noted that the gates 38 and 39 are spaced from the source-drain regions 26, 27 or 31, 32 at this point.

FIG. 8 shows the device after a photoresist layer 41 is applied and patterned to mask the P+ implant. This photoresist mask operation leaves photoresist everywhere except over the P-channel transistor areas. A boron implant of $3.5 \times 10^{13}$ dosage produces P-type regions 42 and 43 for the P-channel transistor in the N-type tank region 15. As will be explained, this implant also provides the "exposed gate oxide" implant for the N-channel transistors Q3 when the process is used to make arrays of memory cell, for example.

Turning now to FIG. 9, the photoresist coating 41 is removed and another photoresist coating 44 applied and patterned to cover the P-channel transistors Q2. The mask used for this purpose may be the complement of that used for the coating 41. A phosphorus or arsenic implant of $3.5 \times 10^{13}$ dosage produces the N-type regions 45 and 46 which self-align with the gate 38 and bridge the gap between the source and drain regions 31 and 32 and the gate. Again, this implant provides the "exposed gate oxide" implant for the P-channel transistors, as will be explained.

The implants are activated by subjecting the slices to a temperature of about 950° C. in steam for about 10 minutes at this point. The thickness of the oxide over the implanted regions 42,43 and 45,46 is increased from 600 Å to 1000 Å during this operation, serving to prevent phosphorus from out diffusing from the multilevel oxide into the silicon during the next step.

Turning now to FIG. 10, the next step is deposition of an interlevel oxide layer 47 to a thickness of about 6000 Å. The layer 47 is then densified by heating at 1000° C. in a non-oxidizing atmosphere. The oxide layer 47 is patterned by a photoresist operation to open holes at contact areas 48,49 and 50 where metal-to-silicon contacts are to be made. A thin film of polysilicon is deposited using plasma deposition. An aluminum film is deposited over the entire top surface of the slice then patterned to leave only the metal interconnections such as the strips 51 and 52. A protective overcoat (not shown) is added and patterned to expose bonding pads, then the slice scribed and broken into individual bars which are mounted in packages.

Figure 11:
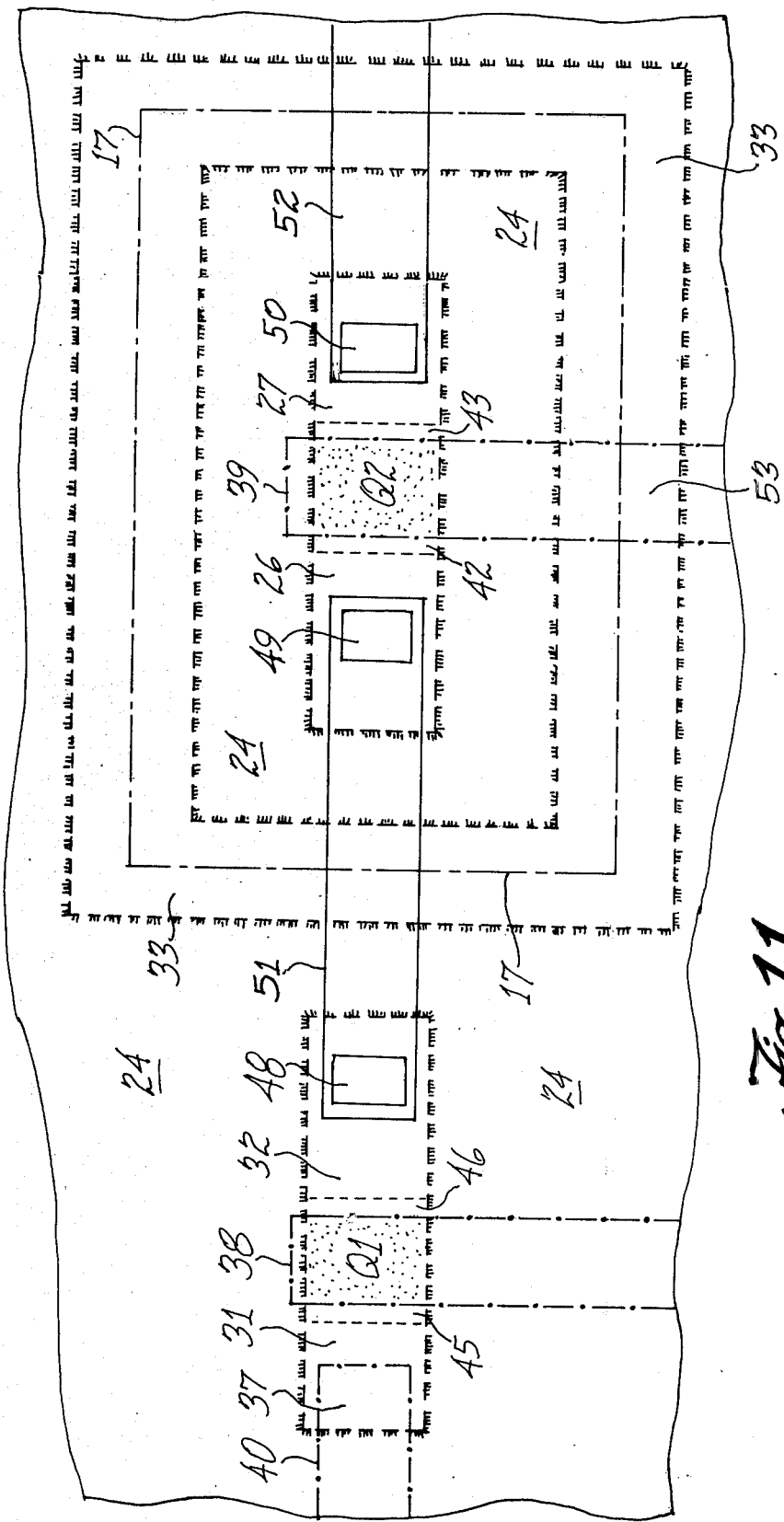
FIG. 11 is a plan view of the completed chip of FIG. 10.

An important feature of the process described above is that the source and drain regions 26,27 and 31,32 are defined prior to the time the polysilicon gates 38,39 and interconnects 40, etc., are deposited and defined. Therefore, the source/drain regions (and elongated interconnects thereto in the silicon) or other moat areas may run under polysilicon strips without forming transistors. An example of this is at area 53 of FIG. 11. The designer is thus afforded three independent levels of interconnect: source/drain, polysilicon, and aluminum. Another feature is that the polysilicon is singly-doped instead of doubly-doped, eliminating the need to interconnect P-type poly and N-type poly by aluminum in order to avoid a diode. Prior silicon gate processes, with no source/drain interconnect capability, had essentially 1.5 levels of interconnect; aluminum plus doubly-doped polysilicon. The poly level counted as one-half since it was not fully independent of moat. A metal gate CMOS process had two full levels of interconnect: source/drain and aluminum. The advantage of three levels is higher component density.

One of the problems is defining the source/drain regions prior to poly is alignment. The gate must have some finite source/drain overlap; this would require a design overlap of two microns so misalignment of masks (within production tolerances) cannot result in a no overlap situation. This two micron overlap, however, adversely affects speed because of the gate to source/drain capacitance. For this reason, the standard self-aligned gate process has been favored; the poly gate is defined first then used as a diffusion or implant mask in defining the source and drain regions. The standard self-aligned gate process precludes source/drain from running under poly, however, because whenever moat and poly lines cross a transistor is formed.

In the process described herein, the foregoing difficulties are circumvented by the self-aligning implants of FIGS. 8 and 9. When the poly gates 38,39 are defined, see FIG. 7, the edges of the gates are spaced from the interior edges of the source/drain regions 26,27 and 31,32 by an amount at least equal to the alignment tolerance. The P+ and N+ implants then self-align the gates with the source/drain regions by creating the regions 42,43 and 45,46.

In prior self-aligned CMOS processes, the polysilicon over N-channel devices is doped N-type by the source/drain diffusion, while the polysilicon over the P-channel devices is doped P-type by the P+ source/drain diffusion. Direct connection of these doubly-doped polysilicon segments will result in a diode, so P-type poly was connected to N-type poly via aluminum, a compromise of density. In the process of this invention, however, the poly is doped uniformly N-type immediately after deposition and before patterning (FIG. 7) resulting in singly-doped poly. The subsequent self-aligning implants are sufficiently light that they do not affect the conductivity of the poly.

Important features of the invention are: aluminum can make contacts to the source/drain regions; polysilicon can make contacts to the source/drain regions; aluminum can run over poly lines; self-aligned transistors are fabricated; aluminum can make contacts to polysilicon; and source/drain regions can run under poly lines. At the same time, circuit density is high and the process is relatively simple and alignments non-critical.

Figure 12:
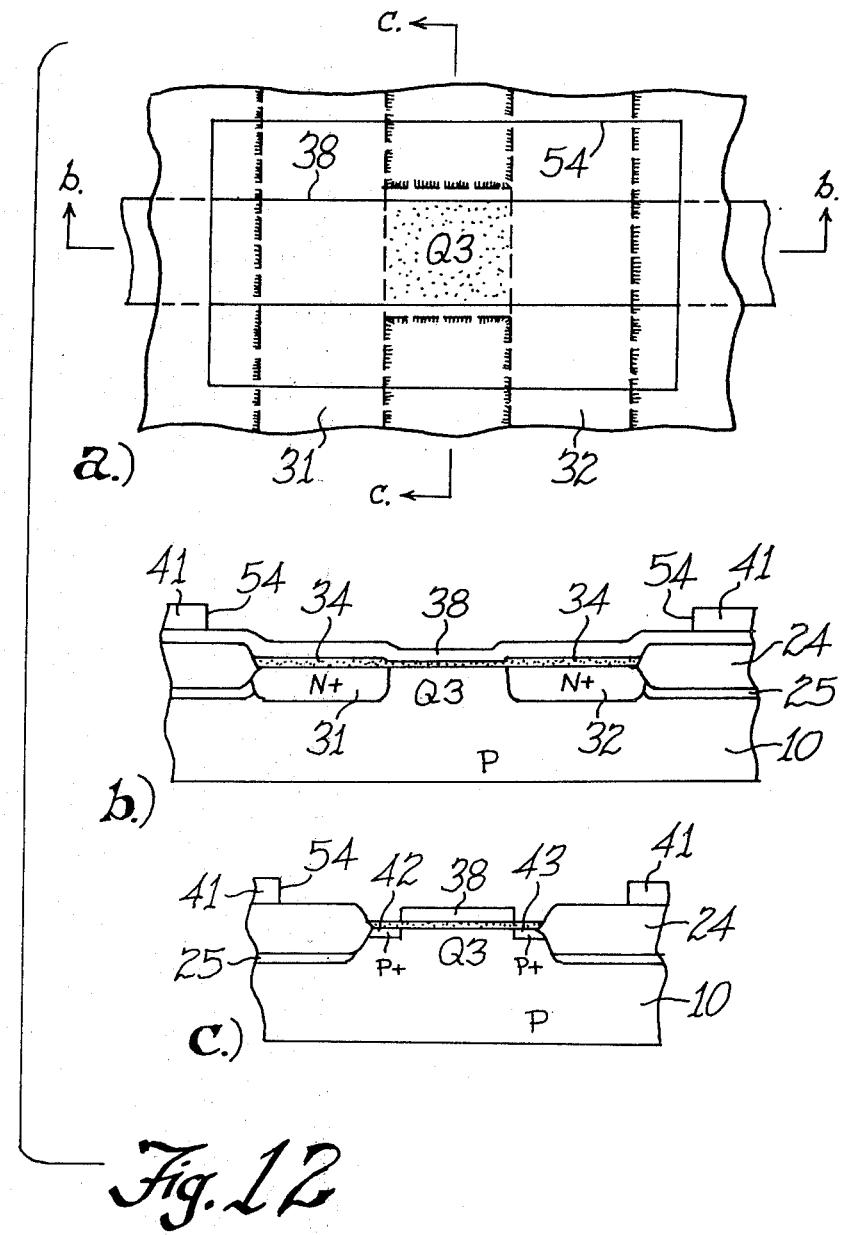
FIGS. 12a-12c are plan and section views of the semiconductor chip of FIGS. 1-11 showing another feature of the invention.

A further important advantage of the process of this invention is the ability to take advantage of the "exposed gate oxide" implant technique of U.S. Pat. No. 4,061,506 granted to David J. McElroy, assigned to Texas Instruments. In a device such as a ROM or gate array as seen in FIGS. 12a-12c, source and drain lines 31,32 in an N-channel transistor Q3 run parallel to one another and perpendicular to a poly line 38; the channel length is no longer defined by the width of the poly but instead by the spacing between the source/drain lines 31,32. A corresponding P-channel transistor in a tank 15 would have equivalent structure. The gate moat is made wide enough to match or slightly exceed the width of the poly line 38, but by design or by misalignment within tolerance gate oxide is exposed in the areas on the sides of the poly line. These exposed gate oxide areas are implanted by an impurity opposite the source/drain type to prevent surface leakage and degradation with time due to the thin oxide. Thus, the P-channel self-aligning implant (FIG. 8) is also used for the N-channel "exposed gate oxide" implant, producing P-type regions 42,43 seen in FIGS. 12a-12c. Likewise, when the N-channel self-align implant (FIG. 9) is made, then P-channel transistors of the type seen in FIGS. 12a-c will at the same time receive an N-type "exposed gate oxide" implant. No additional masking steps are required; the photoresist 41 of FIG. 8 covers all N-channel transistors Q1 of the type seen in FIG. 8, but exposes all those of the Q3 type seen in FIGS. 12a-12c by an opening 54 in the photoresist, and in the same manner the photoresist 44 of FIG. 9 covers all P-channel transistors Q2 of the type in FIG. 9 but exposes all P-channel transistors corresponding to the Q3 type (but P-channel) seen in FIGS. 12a-12c.

What is claimed is:

1. A method of making complimentary insulated gate field effect transistors in an integrated circuit comprising the steps of:
   (a) introducing N-type impurity into a selected area of a face of a P-type semiconductor body to provide a tank region for forming a P-channel transistor,
   (b) selectively growing thick field oxide using an oxidation mask to provide a first enclosed surface area on said face spaced from said tank region and a second enclosed surface on said face within said tank region,
   (c) introducing P-type impurity into the second surface area to produce conductor regions and to produce source and drain regions of the P-channel transistor, while masking the first surface area,
   (d) and introducing N-type impurity into the first surface area to produce conductor regions and to produce regions of the N-channel transistor while masking said second surface area,
   (e) thereafter depositing a layer of conductive material on said face over a thin gate insulator and patterning to provide a gate of an N-channel transistor in said first surface area but spaced from the source and drain regions and a gate of a P-channel transistor in said second surface area but spaced from the source and drain regions, the conductive material also extending across conductor regions but insulated therefrom,
   (f) and implanting N-type and P-type inpurity into the first and second surface areas, respectively, self-aligned with said gates, adjacent said source and drain regions.

2. A method according to claim 1 wherein both the gate of the N-channel transistor and the gate of the P-channel transistor are spaced from the respective source and drain areas prior to said step of implanting.

3. A method according to claim 1 wherein the step of patterning the layer of polycrystalline silicon includes defining interconnects which cross over said source or drain regions.

4. A method of making complementary insulated gate field effect transistors in an integrated circuit comprising the steps of:
   (a) introducing one type of impurity into a selected area of face of a semiconductor body of the opposite type to provide a tank region for forming a transistor of one type,
   (b) introducing impurity of said opposite type into the surface of said tank region to produce conductor regions and to produce source and drain regions of the transistor of said one type, while masking a surface area spaced from the tank region,
   (c) and introducing impurity of said one type into said surface area to produce conductor regions and to produce source and drain regions of a transistor of the other type, while masking said tank region,
   (d) thereafter depositing a layer of conductive material on said face over a thin gate insulator and patterning the conductive material to provide a gate of the transistor of the other type on said surface area and a gate of the transistor of said one type on said tank regions and to provide conductors crossing over said conductor regions but insulated therefrom, (e) and implanting said one type and said opposite impurity into said surface areas and said tank region respectively, self-aligned with said gates, adjacent said source and drain regions.

5. A method according to claim 4 wherein both of said gates of both of the transistors are spaced from the respective source and drain areas prior to said step of implanting.

6. A method according to claim 4 wherein the step of patterning the layer of conductive material includes defining interconnects which cross over said source or drain regions.

* * * * *